United States Patent [19]

Skertic

[11] Patent Number: 5,006,505

[45] Date of Patent: Apr. 9, 1991

[54] PELTIER COOLING STAGE UTILIZING A SUPERCONDUCTOR-SEMICONDUCTOR JUNCTION

[75] Inventor: Matthew M. Skertic, Chatsworth, Calif.

[73] Assignee: Hughes Aircraft Company, Los Angeles, Calif.

[21] Appl. No.: 229,883

[22] Filed: Aug. 8, 1988

[51] Int. Cl.$^5$ ............... H01L 25/04; H01L 35/28; F25B 21/00

[52] U.S. Cl. ............... 505/1; 357/87; 357/83; 357/84; 357/82; 136/203; 136/204; 505/894; 505/897

[58] Field of Search ............ 357/83, 84, 87; 505/898, 1, 894, 895, 897; 136/203, 204, 291

[56] References Cited

U.S. PATENT DOCUMENTS

| Re. 30,652 | 6/1981 | Germano et al. | 357/87 |
|---|---|---|---|
| 3,136,134 | 6/1964 | Smith | 136/203 |
| 3,392,061 | 7/1968 | Schreiner et al. | 136/203 |
| 3,414,405 | 12/1968 | Fisher | 357/87 |
| 4,362,023 | 12/1982 | Falco | |

FOREIGN PATENT DOCUMENTS 2207321 1/1989 United Kingdom .

OTHER PUBLICATIONS

"High Temperature Superconductivity in Y-Ba-Cu-O Identification of a Copper-Rich Superconducting Phase", Stacy et al., J. Am. Chem. Soc. 1987, vol. 109, No. 8, pp. 2528-2530.

H. J. Goldsmit et al., "High-Tc Superconductors as Passive Themo-Elements", Feb. 1988, pp. 344-348, p. 345, p. 347. Journal of Physics D/Applied Physics, vol. 21, No. 2.

Patents Abstracts of Japan, vol, 13, No. 184 (E-751) (3532) Apr. 28, 1989 & JP, A 01009671 (Mitsubishi) Jan. 12, 1989.

Electronics International, vol. 53, No. 17, Jul. 1980. D. A. Zeskind: "Thermoelectric Heat Pumps Cool Packages Electronically", pp. 109-113, 110.

*Primary Examiner*—Rolf Hille
*Assistant Examiner*—Mahshid Saadat
*Attorney, Agent, or Firm*—R. M. Heald; C. D. Brown; W. K. Denson-Low

[57] ABSTRACT

A practical cryogenic Peltier cooler is devised by replacing one of the semiconducting elements in a conventional peltier cooler with an element comprised of bulk, or thin film superconducting material. In the preferred embodiment, a rare-earth, a barium copper oxide superconductor of the form $Yb_aCu_3O_x$ is utilized. The superconducing elements are placed in an alternating series with semiconducting elements comprised of bismuth telluride of the form $Bi_2Te_3$ (n-type). Performance may be improved in an alternative embodiment by utilizing instead a bismuth antimony semiconductor of the form $Bi_{85}Sb_{15}$ (n-type). As a result, cryogenic Peltier coolers can be devised with useful refrigeration capacities and stable cold temperatures of 65-80 degrees Kelvin and below, while heat sinked to a higher temperature.

20 Claims, 3 Drawing Sheets

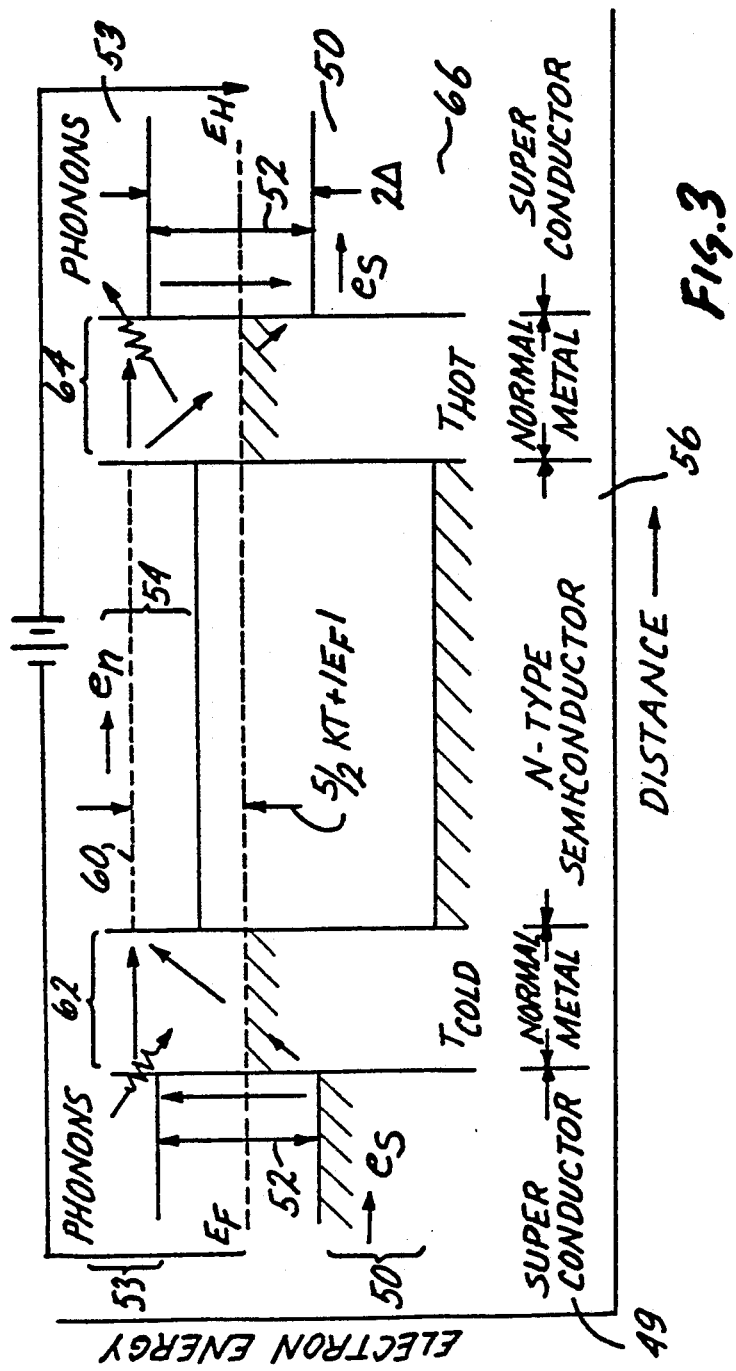

PELTIER COOLING STAGE UTILIZING A SUPERCONDUCTOR-SEMICONDUCTOR JUNCTION

BACKGROUND OF THE INVENTION

1. Field of the Invention

The invention relates to the field of Peltier, or thermoelectric coolers and in particular to Peltier coolers using semiconductor materials.

2. Description of the Prior Art

A Peltier cooler is a well known cooling device wherein an electrical current is passed through a series of electrical junctions between unlike materials with high Seebeck coefficients. Because of the change in specific electron entropy when electrons flow across junctions of unlike materials, heat is released in the form of phonons or high frequency lattice vibrations at one junction and absorbed at the opposite junction. As a result of the phonon creation and destruction, one junction heats up while the other is cooled. The number of junctions can be replicated in a serial electrical connection of elements of opposing junctions to increase cooling and heating capacity. The devices may be staged, with one device heat sinked to another, to increase the total temperature differential spanned by the staged series of devices.

However, the cooling capacity of conventional Peltier coolers is dependent upon the integrated electron entropy of the distribution of electrons in the quantum energy levels of the conduction bands in the materials comprising each side of the Peltier junction. This in turn is dependent upon the temperature of the junction. While useful devices may be fabricated from a series of semiconductor-to-semiconductor junctions or metal-to-metal junctions, such prior art Peltier coolers become inefficient at lower temperature, particularly in the cryogenic range below 150 degrees Kelvin.

Therefore, what is needed is a Peltier cooler design which operates efficiently at cryogenic temperature and provides a useful amount of refrigeration.

BRIEF SUMMARY OF THE INVENTION

The invention is a Peltier cooler comprising a first electrode, a superconductor element electrically coupled to the first electrode, a semiconductor element electrically coupled to the superconductor element, a second superconductor element electrically coupled to the semiconductor element, and a second electrode electrically coupled to the second superconductor element. Electrons flow under an applied voltage from the first electrode through the first superconductor element, semiconductor element, second superconductor element and second electrode. The electrical junction between the first superconductor element and semiconductor provides Peltier cooling, while the electrical junction between the semiconductor element and the second superconductor element provides Peltier heating. As a result of cooling to a cold cryogenic temperature at the cold junction and emitting heat at a warmer temperature at the hot junction, but still below the superconductor transition temperature, a cryogenic Peltier cooler is provided.

The Peltier cooler further comprises first and second normally conducting metallic elements. The first superconductor element and semiconductor element are electrically coupled together through the first normally conducting metallic element. The semiconductor element and second superconductor element are electrically coupled together through the second normally conducting metallic element. The first and second normally conducting metallic elements are disposed between the first superconductor element and semiconductor element, and between the semiconductor element and the second superconductor element respectively. The first and second normally conducting metallic elements are in opposed spaced-apart positions from each other.

The first and second superconductor elements are composed of a high transition temperature superconducting ceramic.

In the preferred embodiment, the high transition temperature superconductor material is of the form:

$$RBa_2Cu_3O_x$$

where R is a rare-earth element and x is a finite number.

In the illustrated embodiment, the rare-earth element is Yttrium. The semiconductor element is bismuth telluride. The bismuth Telluride is of the form, $Bi_2Te_3$ and is n-doped.

In another embodiment, the semiconductor element is an alloy of bismuth and antimony. The bismuth antimony is of the form $Bi_{85}Sb_{15}$ and is n-doped.

The Peltier cooler further comprises a multiple of additional alternating superconductor and semiconductor elements each electrically coupled in series with each other and to the second superconductor element. An additional semiconductor element is electrically coupled to the second superconductor element, and an additional semiconductor element is coupled to the additional superconductor element. The series continues in alternating sequence with superconductor and semiconductor elements comprising a multiple of Peltier junctions therebetween.

The first and second superconductor elements are single crystal or polycrystalline bulk material segments and the semiconductor element is a crystalline segment, typically of a rectangular parallelpiped shape. The superconductor and semiconductor elements are alternately soldered to metal strips to form the Peltier device.

This invention is also characterized as a Peltier cooler comprising a plurality of bulk yttrium-barium-copper oxide ceramic high transition temperature superconductor segments, a plurality of normally conducting metal strips, and a plurality of semiconductor crystalline segments. The plurality of superconductor crystalline segments and semiconductor crystalline segments form an alternating series with one of the superconductor segments electrically coupled to one of the semiconductor segments electrically coupled to a following one of the superconductor segments and so forth in like manner. Each of the superconductor and semiconductor segments are electrically coupled together through one of the normally conducting metal strips. As a result, a practical Peltier cooler is provided.

The invention is still further a method of fabricating a Peltier cooler composed of stacks comprising the steps of assembling an alternating array of rare earth-barium-copper oxide superconductor thin films and semiconductor thin wafers for the purpose of minimizing heat conduction between hot and cold junctions. Each superconductor film is adjacent to, electrically coupled to and precedes a semiconductor wafer in the array. Each semiconductor wafer, in turn, is adjacent to and electrically coupled to a following superconductor thin film. Each semiconductor wafer and superconductor thin film is separated by an insulating layer within the array except along a predetermined edge wherein is disposed a thin film metallic strip. The metallic strips disposed between each of the semiconductor and superconductor layers are arranged and configured in two sets. A first set is disposed at one edge of the superconductor film and semiconductor wafers and a second set is disposed at the opposite distant edge of the superconductor film and semiconductor layers. The first and second sets of normally conducting metallic strips form an alternating array. The first set comprises a plurality of cold Peltier junctions and the second set comprises a plurality of hot Peltier junctions. The method continues with the step of brazing the plurality of semiconductor wafers, superconductor films and metallic strips together. The plurality of semiconductor wafers and superconductor films and metallic strips are simultaneously pressed together during the step of brazing.

Turn now to the following drawings wherein like elements are referenced by like numerals and wherein the invention can be better visualized.

BRIEF DESCRIPTION OF THE DRAWINGS

FIG. 3 is an energy diagram illustrating the quantum mechanical kinetics of an electron transmitted across a superconductor-to-semiconductor Peltier junction pair of the invention.

The invention and its various embodiments may be better understood by turning to the following detailed description.

DETAILED DESCRIPTION OF THE PREFERRED EMBODIMENTS

A practical Peltier cooler is devised by replacing one of the semiconductor elements in a conventional Peltier cooler with a superconductor material element. In the preferred embodiment, a rare earth-barium-copper oxide ceramic is utilized as the superconductor element and in particular a yttrium-barium-copper oxide superconductor of the form $YBa_2Cu_3O_x$. The superconductor elements are formed in an alternating series with the semiconductor elements comprised of bismuth telluride. Performance may be improved in an alternative embodiment by utilizing instead a bismuth antimony semiconductor of the form $Bi_{85}Sb_{15}$. As a result, Peltier coolers can be devised with useful refrigeration capacities and stable cold temperatures of 65–80 degrees Kelvin and below.

The illustrated embodiment is described in the context of a Peltier junction which includes a stack of layers wherein each junction in turn is comprised of a superconductor, metal and semiconductor sandwich. Peltier cooling results from the flow of electrons from the paired electron ground states in the superconductor into the conduction band of an n-type semiconductor. Heat absorption arises from the electronic latent heat of transition accompanying the breakup of electron pairs across the energy gap of the superconductor and from the transition to the higher energy levels in the semiconductor.

The illustrated embodiment is further described in connection with a barium copper oxide superconductor which has a relatively high transition temperature, namely approximately 95 degrees Kelvin. The ceramic superconductor is specified by the formula $RBa_2Cu_3O_x$, where R stands for one or more rare earth elements, preferably yttrium. The mechanism of superconductivity in such high transition temperature ceramic superconductors is not completely understood at the present time. However, the illustrated ceramic is described generally in Wu et al., "*Superconductivity at 93K in a New Mixed Phase Y-Ba-Cu-O Compound System at Ambient Pressure*":, Physical Review Letters, Vol. 58, No. 9, Mar. 2, 1987, incorporated herein by reference. Therefore, it must be clearly understood that any superconductor which is now known or later devised, including known and to-be-discovered high temperature superconductors are expressly included within the scope of the invention.

Figure 1:
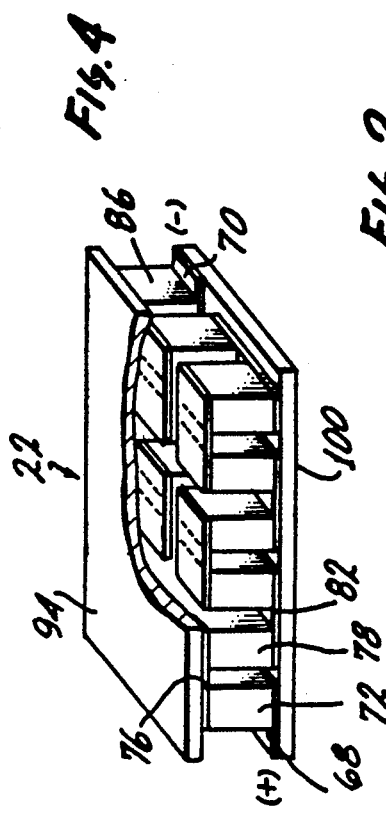
FIG. 1 is a diagrammatic side view of an infrared detector assembly in which a Peltier cooler according to the invention is incorporated.

Turn now to FIG. 1 wherein an infrared detector assembly, generally denoted by reference numeral 10, is shown in a highly diagrammatic side view. The infrared detector, in the form of a focal plane array 16, is included within a dewar housing 12. The end of the dewar is provided with an optical infrared transmitting window 14 which allows infrared energy to enter the dewar 12.

Focal plane array 16 is maintained within an enclosed cold shield 18 which provides stray radiation shielding for focal plane array 16 while allowing infrared energy to pass through an end aperture 20 in shield 18 opposing window 14. Shield 18 may include optics, not shown, which focus the infrared radiation onto focal plane array 16 within dewar 12 beneath window 14. The focal plane array is disposed on and thermally coupled to a Peltier cooler generally denoted by reference numeral 22. Cooler 22 in turn is mounted on a ceramic substrate detector card 24 to which the cold shield 18 is also coupled. Card 24 is positioned within dewar 12 just above and is thermally coupled to a conventional Joule-Thomson cryostat 26. Cryostat 26 provides a first stage of cooling within infrared detector assembly 10 so that detector card 24 is brought to a cryogenic temperature of approximately 87 degrees Kelvin when the cryostat 26 coolant is argon. Peltier cooler 22 further drops the temperature at its cold junction end to approximately 65–80 degrees Kelvin. In this manner the focal plane array is maintained at an optimal cold operating temperature.

Figure 2:
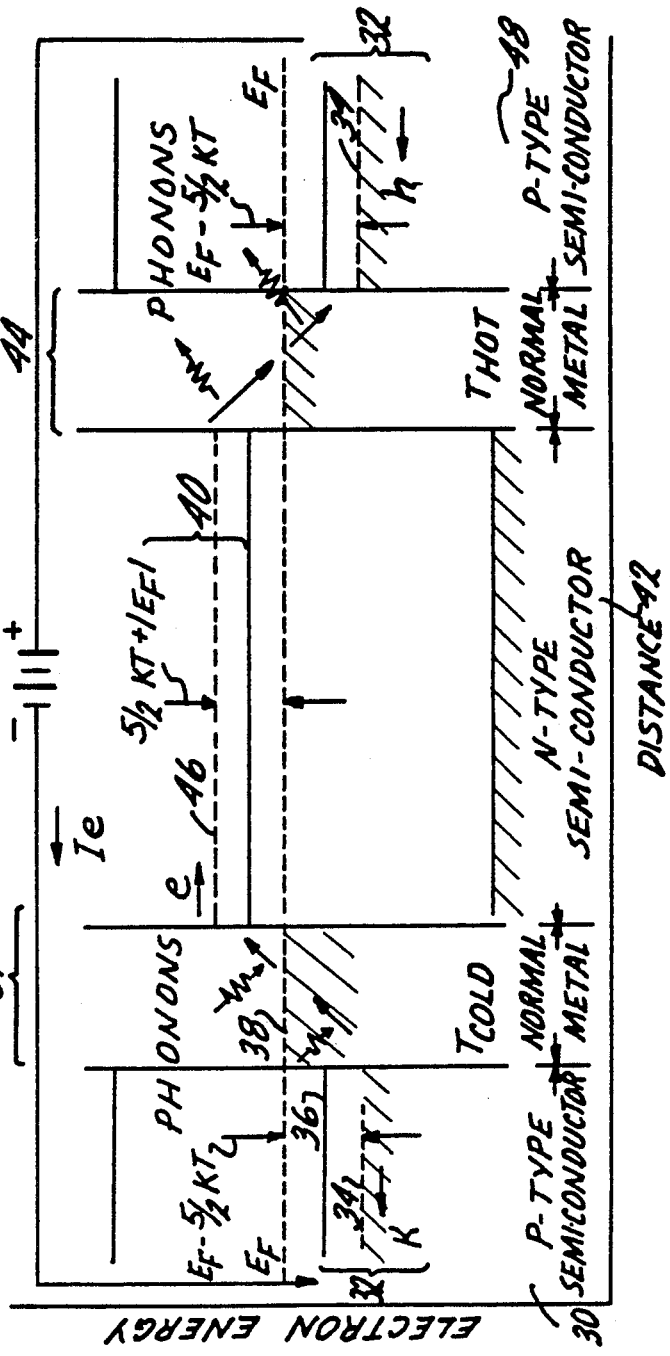
FIG. 2 is an energy diagram illustrating the quantum mechanical kinetics of an electron transmitted across a conventional semiconductor-to-semiconductor Peltier junction pair.

Before considering further details concerning infrared detector assembly 10 and Peltier cooler 22, turn first to the electron energy diagram of FIG. 2 which depicts the electron energy kinematics as a function of distance along a conventional semiconductor-to-semiconductor Peltier junction pair. In FIG. 2 the vertical axis of the diagram represents electron energy while the horizontal axis represents distance across the Peltier junctions in a direction perpendicular to the plane of the junction. Region 30 to the left in FIG. 2 represents the element length of a conventional p-type semiconductor immediately to the left of the first Peltier junction. The lower band 32 represents the partially filled valence band within the p-type semiconductor with level designator 36 representing electron energy states near the top of the valence band and approximately 5/2 kT below the Fermi level 38. The thermal distribution of filled electron states in the valence band is produced as thermally ionized holes from acceptor level within the forbidden band, not shown, move downward into the valence band and contribute to the electrical conductivity as carriers of positive charge. At the first Peltier junction, electrons flow from the p-type semiconductor through the normal metal layer 37 at energy levels near the Fermi level 38, and into the n-type semiconductor 42.

The n-type semiconductor is located immediately to the right of metallic layer 37 and is characterized by a partially filled conduction band 40 within the n-type semiconductor 42. Energy level designator 46 represents electron energy states near the bottom of the conduction band and approximately 5/kT above the Fermi level 38. The thermal distribution of filled electron energy states in the conduction band is produced as thermally ionized electrons from donor levels within the forbidden band, not shown, move upward into the conduction band and contribute to the electrical conductivity as negatively charged carriers.

Immediately adjacent to the right edge of the n-type semiconductor is another normally conducting metallic layer 44 followed by a p-type semiconductor element 48 characterized by valence band 32 and filled energy levels 34.

Now when electrical current is caused to flow as a result of the potential across the p-n-p junctions of FIG. 2, it is possible through physical laws for an electron within the valence band 32 at levels 36 of p-type semiconductor region 30 at the left in the diagram of FIG. 2 to increase in energy, be transported through metallic layer 37 and into a conduction band energy level, such as 46 within conduction band 40 of n-type semiconductor 42. However, the increase in the energy of the electron, in conformity with the law of conservation of energy, is due in part to the applied voltage and absorption of phonons or lattice vibrations, which are sensed as cooling in the vicinity of the leftmost junction of FIG. 2. Phonons are absorbed, and hence the junction cools. The electron is then transported at the higher conduction energy level 46 through n-type semiconductor 42 to the second junction in the vicinity of metal layer 44. Here the electron quantum mechanically decreases in energy as it is transported across the junction between n-type semiconductor 42 and p-type semiconductor 48 to assume an energy state 34 near the top of the valence band 32 of p-type semiconductor 48. Again, in observance of the law of conservation of energy, the electron gives up energy manifested as phonons, during the junction transition, which is translated into lattice vibrations or heat. Therefore, the junction in the vicinity of metallic layer 44 is the hot junction.

Consider now the Peltier cooler devised according to the present invention as diagrammatically depicted in an analogous energy diagram of FIG. 3. The Peltier cooler of the present invention is implemented by modifying a conventional Peltier cooler to replace the p-type semiconductor with a superconductor. The superconductor contributes equivalent thermo-power by virtue of its latent heat of transition, that accompanies the breakup of paired ground state electrons, but without the Joule heating and without some of the heat conduction losses that are characteristic of a semiconductor. As a result, it is possible then to construct a Peltier cooler which will operate at cryogenic temperatures. Conventional semiconductor Peltier coolers based upon the mechanism described in connection with FIG. 2 are in fact not practical below approximately 150 degrees Kelvin because of high thermal losses and reduced Seebeck coefficients, particularly in the p-type semiconductor.

In the junction of the invention as seen in FIG. 3, a first superconductor element 49 is characterized by a normal conduction band 53 and a superconducting band 50 with an energy gap 52 therebetween. Cooling takes place as the electrons, under the influence of an applied potential across the junctions, transition from superconducting band 50, which contains the electron pair responsible for the supercurrent, to normal conduction band 53 and into conduction band 54 of the n-type semiconductor 56. Phonons are absorbed in this electron transition and hence cooling is achieved. Again n-type semiconductor 56 is characterized by conduction band 54 and representative filled energy level 60. In order to make the quantum mechanical transition from superconducting band 50 to normal conduction band 53 within superconductor 49, electrons within superconductor 49 must jump gap 52 and, in observance of the law of conservation of energy, do so in part by virtue of the applied voltage and more significantly through absorption of phonons within the vicinity of the interlying normally conducting metal layer 62 between superconductor 49 and n-type semiconductor 56. This is referred to as the latent electron heat when transitioning from the superconducting phase to the normal phase, and is sensed as a drop in temperature within the junction vicinity of metallic layer 62.

As before, electrons then are conducted through conduction band 54 of semiconductor 56 to a junction in the vicinity of normally conducting metallic layer 64 between n-type semiconductor 56 and a second superconductor element 66. Again, superconductor 66 is characterized by superconducting band 50, a normally conducting band 53 and an energy gap 52 therebetween. Electrons, in the process of crossing the junction in the vicinity of metal layer 64, degrade in energy upon transitioning from the conduction band 54 of n-type semiconductor 56 to the superconducting energy state assumed within superconducting band 50 of superconductor 66. The electron transitions to superconducting band 50, and heat or phonons are emitted. The junction 56-64-66 heats.

The result is that approximately the same magnitude of thermo-power is realized in the Peltier junction pair of FIG. 3 as in the conventional Peltier junction of FIG. 2. However, the superconductor Peltier junctions are not degraded by low temperature like the semiconductor junctions and do not suffer from high cooling losses.

Although the conservation of energy then dictates that the lost electron energy then appear elsewhere, namely as the phonons emitted within the vicinity of the junction of metal layer 64 which is sensed as Peltier heating, energy is also consumed from the DC power which biases electrons across the two junctions. The applied voltage and the input energy is necessary to move the electrons against the Seebeck voltage and to overcome ohmic friction.

The relative performance of the conventional Peltier cooler as compared with a superconducting cooler according to the invention can be better understood by considering the following calculations. Assume the cooler is coupled to a heat sink of 87 degrees Kelvin, and utilizes a bismuth-telluride semiconductor material (n-type $Bi_2Te_3$) and a yttrium-barium-copper oxide ($YBa_2Cu_3O_x$) ceramic superconductor Peltier junction. This cooler can now be specifically compared against a conventional bismuth-telluride Peltier junction. Utilizing published material parameters appropriately inserted into the following formulae for these materials, it can be shown that optimum coefficient of performance levels and power requirements are suitable for a practical cryogenic cooler in a geometry configuration compatible with conventional infrared detector packages. In fact the superconductor Peltier cooler out performs the conventional semiconductor Peltier cooler at cryogenic temperatures.

The Coefficient of Performance (COP) is given by Net Refrigeration Output divided by Power Input. For a Peltier cooler, the Net Refrigeration Output is given by gross refrigeration minus one-half of the Joule heating losses minus the thermal conduction losses, or $$Q = \text{Net Refrigeration Output} \quad (1)$$
$$= N\{I[a_1 + a_2]T_c - [I^2/2][(p_1L_1/A_1) + (p_2L_2/A_2) - T[(k_1A_1/L_1) + (k_2A_2/L_2)]\}$$

where
$a_j$ = thermopower of the jth material (V/K)
$p_j$ = electrical resistivity of the jth material (ohm-cm)
$k_j$ = thermal conductivity of the jth material (W/cm-K)
I = electric current flowing through junction (A)
$A_j$ = cross section area of jth material leg (cm2)
$L_j$ = length of jth material leg (cm)
N = number of series junctions in the device, and
$T - T_H - T_C$ = temperature difference between hot ($T_H$) and cold ($T_C$) junction.

Similarly, the power input is given by the sum of the Joule electrical power losses and the Thomson electrical work, or $$P = N\{I^2[(p_2L_2/A_2) + (p_2L_2/A_2)] + I[a_1+a_2]T\} \quad (2)$$

The Coefficient Of Performance after optimization is given by $$\text{COP Optimum} = [Tc/T]\{[(1+ZT)^{\frac{1}{2}} - T_H/T_C]/[(1+ZT)^{\frac{1}{2}} + 1]\} = \eta\gamma \quad (3)$$

where
$\eta$ = Carnot efficiency = $T_C/[T_H - T_C]$
$\gamma = [(1+ZT)^{\frac{1}{2}} - T_H/T_C]/[1+ZT)^{\frac{1}{2}} + 1]$
Z = Figure of Merit
$= [a_1+a_2]^2/\{[(p_1L_1/A_1)+(p_2L_2/A_2)][k_1A_1/L_1)+(k_2A_2L_2)]\}$ and
$\overline{T} = [T_H + T_C]/2$ Another useful expression is the maximum T that can be sustained at zero refrigeration, given by $$\Delta T_{max} = Z(T_C)^2/2$$

For the designs in comparison, the superconductor Peltier cooler will sustain a maximum $\Delta T$ of 13 degrees K while the semiconductor Peltier cooler will sustain only 4 degrees K. This performance comparison alone is sufficient to illustrate that the semiconductor Peltier cooler is impractical at these cryogenic temperatures. Further performance analysis as developed next will illustrate that the superconductor Peltier cooler is a practical device.

Assuming that the temperature of the hot junction is 87 degrees Kelvin, that the temperature of the cold junction is 80 degrees Kelvin, that the transition temperature of the superconductor is 95 degrees Kelvin, and by utilizing the above equations and the published parameters for the materials the value of $\overline{ZT}$ is found for the superconductor Peltier cooler to be 0.36. This yields a COP of 0.35 for a $\Delta T$ of 7 degrees K. The thermopower of the superconductor has been taken as $\frac{1}{2}$ of the temperature dependent bandgap energy at the hot sink temperature of 87 degrees K, which is approximately 1.75 kTc, divided by the cold temperature of 77 degrees K. The symbol kTc refers to the Boltzmann constant times the superconductor transition temperature. A comparable conventional semiconductor Peltier cooler provides a zero useful COP for the same T of 7 degrees K.

A typical Peltier cooler design configuration for an infrared detector assembly might involve a single-stage, nine series junctions device with element dimensions of A=0.0034 cm2 and L=0.13 cm for both junction materials. For 75 milliwatts of refrigeration at the same temperature conditions as before, and using currents which optimize the COP, the current, power input and rejected heat values are, using the published material parameters: 0.6 amps, 215 milliwatts power input and 290 milliwatts heat rejection for the superconductor Peltier cooler according to the invention.

There is a noticeable improvement for a superconductor Peltier cooler according to the invention as compared to a conventional design.

It is expected that as high transition temperature superconductors are improved and the transition temperatures raised, the performance differential between the superconducting Peltier cooler of the invention and a conventional Peltier cooler will increase even further. In addition, the hot sink temperature would be raised also, and other types of cryocoolers, other than the JT cryostat, could be used as the first stage cryocooler.

Figure 4:
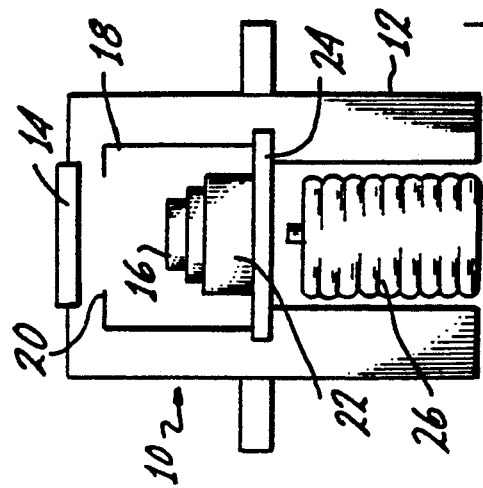
FIG. 4 is a diagrammatic perspective of a Peltier cooler comprised of bulk crystalline superconductor and semiconductor segments according to the invention.

The Peltier cooler configuration of FIG. 4 is representative of a conventional method of constructing conventional semiconductor coolers. The invention may be constructed in this manner with the p-type semiconductor elements replaced by superconductor elements. In FIG. 4, cooler 22 is comprised of a checkerboard layout of semiconductor and superconductor elements, in the form of rectangular parallelepipeds electrically paired to create a series of junctions for cooling and heating, which are sandwiched between two ceramic cards. The upper ceramic card 94 is in thermal contact with the cold Peltier junctions and represents the cold sink, while the lower ceramic card 100 is in thermal contact with the hot junctions and must be thermally coupled to a heat sink. A pattern of aluminum electrical contacts is deposited upon the junction contacting surfaces of the ceramic cards. Electrical contacts 68 and 70 are for connection to an external electrical power source with the indicated polarities. Contact 68, which is deposited on ceramic card 100, is soldered and electrically coupled to a first n-type semiconductor element 72. The other end of the semiconductor element 72 is soldered and electrically coupled to electrical contact pad 76, which is deposited on ceramic card 94. Contact pad 76 extends to the adjacent superconductor element 78 and is soldered to and electrically coupled to the element 78. The superconductor is comprised of bulk yttrium-barium-copper oxide. The semiconductor elements are comprised of an n-type bismuth-telluride semiconductor. A third contact pad 82 deposited onto card 100 is soldered to and electrically coupled to the other end of element 78. The pad 82 extends to an adjacent, on the right, n-type semiconductor element. This serial pattern of semiconductor-to-superconductor connection extends throughout the device until the last element, superconductor 86, is reached. Element 86 is soldered to and in electrical contact with contact pad 70. The electron flow through Peltier cooler 22 is serpentine in that electrons flowing out of semiconductor layer 72 from electrode 68' flow from the right side through a series of superconductor-to-semiconductor elements lying in an adjacent pattern and into the base of element 78 up to its top edge, across metallic contact pad 76 into the semiconductor 72 at the top and then flow downward to a lowermost metallic contact pad 68 and out of the device.

Figure 5:
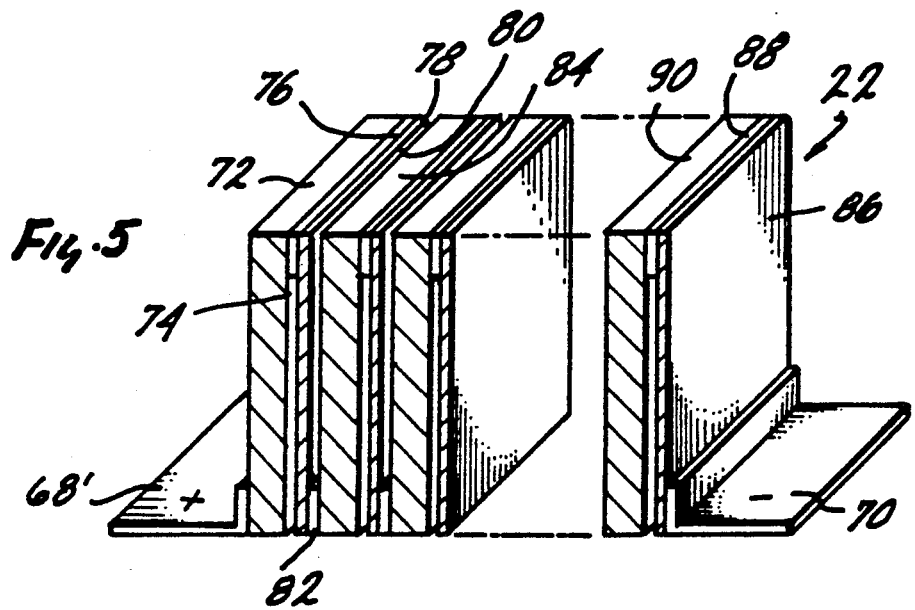
FIG. 5 is a diagrammatic perspective of a Peltier cooler comprised of stacked thin film superconductor layers and thin crystalline semiconductor wafers according to the invention with one edge shown in broken-away view.

Turn now to the illustrated depiction of FIG. 5 wherein a Peltier cooler according to the present invention, but of alternative construction, is depicted in diagrammatic perspective view with a cross-sectional surface exposed. Cooler 22 comprises copper electrical contacts 68' and 70' which are biased with the indicated polarity. Contact 68' is soldered and electrically coupled to a first n-type semiconductor wafer layer 72. Adjacent the semiconductor layer is a thin insulator 74, typically composed of a low thermal conductivity ceramic with matching thermal expansion coefficient, that has been cemented to the semiconductor. Insulating layer 74 covers much of the right surface of semiconductor layer 72 as depicted in FIG. 5 with the exception of a top horizontal strip which is provided with a thin film of normally conductive metallic layer 76, typically composed of evaporated metallic layers such as nickel and indium. Insulating layer 74 has deposited thereon a sputtered thin film of superconductor 78 comprised of yttrium-barium-copper oxide of the illustrated embodiment. A second insulating layer 80 and a normally conducting metallic layer 82 is then disposed against the right side of superconductor layer 78 as depicted in FIG. 5 but in an inverted configuration as compared to insulating layer 74 and metallic strip 76. A second semiconductor layer 84 is then disposed adjacent to and in contact with insulating layer 80 and metallic strip 82. Thus, the portion of the stack comprising layers 72–84 comprise the first two junctions of the Peltier cooler stack, the semiconductor-to-superconductor layer 72-76-78 being the cold junction with the layer sequence 78-82-84 being the hot junction.

As discussed in the illustrated embodiment, semiconductor layers 72 and 90 are comprised of an n-type bismuth-telluride semiconductor. A sequence of semiconductor layers, insulating layers, metallic strips, superconductor layers and so forth continues in a serially periodic pattern as diagrammatically depicted in FIG. 5 until the number of desired junctions is obtained. It can be readily appreciated that the electron flow through Peltier cooler 22 is serpentine in that electrons flowing into superconductor layer 86 from electrode 70 flow from the base of layer 86 up to its top edge, across metallic strip 88 into semiconductor strip 90, and thence downwardly along semiconductor layer 90 to a lower most metallic strip (not shown), which is bonded to the next adjacent superconductor layer in the periodic stack configuration.

The method of fabrication of cooler 22 as shown in FIG. 5 is unique in that the stacked sequence of plane semiconductor wafer dies, which include thin film materials therebetween, are brazed together all at once or pressed together with indium contact.

The cooler stack and its physics now have been described in connection with FIGS. 3, 4 and 5, turn now to the diagrammatic exploded, partial perspective view of FIG. 6 which illustrates details of the mounting of cooler 22 within the infrared detector assembly 10. The two stage cooling concept illustrated in FIGS. 1 and 6 provide certain advantages over certain conventional cryocooler technology normally used in infrared detectors.

Conventional Joule-Thomson cryostats require nitrogen gas in order to obtain a cooldown to approximately 77 degrees Kelvin, and gas mixtures of nitrogen and neon in order to obtain temperatures of approximately 68 degrees Kelvin. Lower cold temperature than this requires a two-gas, two-stage Joule-Thomson cryostat which necessitates not only large sized cryostats, but also heavier and more costly stored gas systems which are not always practical in every given application, particularly applications having limitations of space and weight, as in missiles. Such gas mixtures further suffer from inferior refrigeration capacity which makes them impractical for many military thermal environments. Even nitrogen gas has significantly less refrigeration power than argon. Therefore conventional cryostats used with cold temperatures to 77 degrees Kelvin, or below, typically exhibit such defects as long cooldown times and high ambient temperature limitations.

Figure 6:
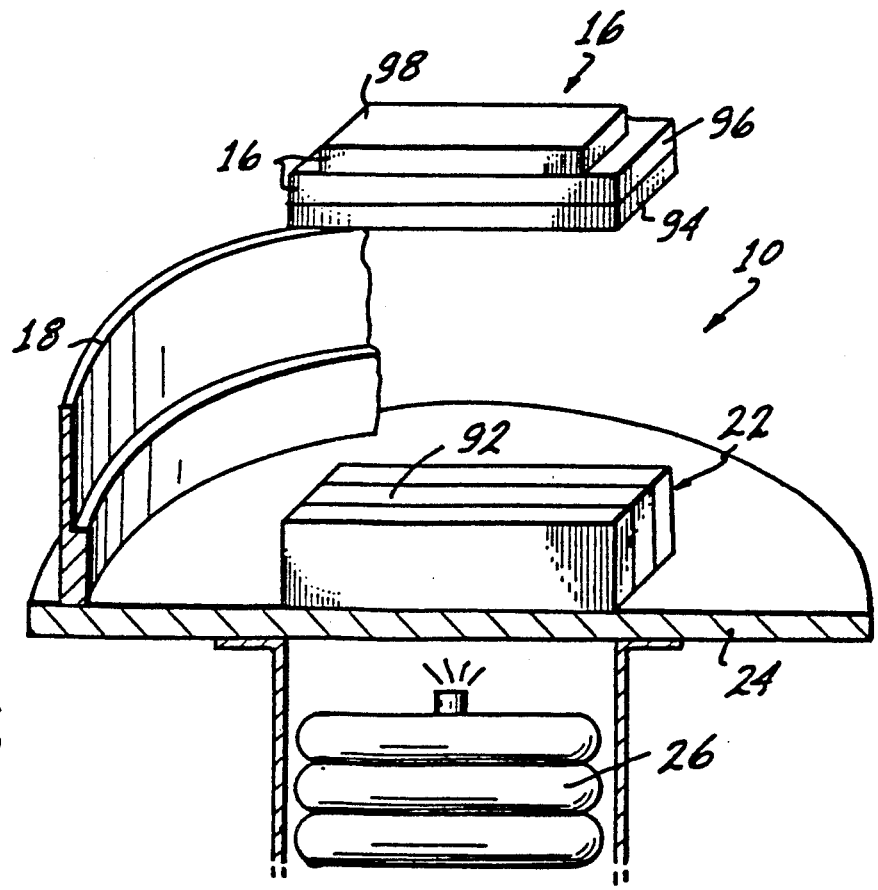
FIG. 6 is an exploded cutaway view of a portion of an infrared detector assembly of the type generally depicted in FIG. 1 incorporating the Peltier stack of FIG. 5.

In the IR detector assembly 10 of FIGS. 1 and 6, argon gas is used in a first stage Joule-Thomson cryostat 26 to achieve a cold temperature of approximately 87 degrees Kelvin at the detector card 24. This is just below the superconductor transition temperature of approximately 95 degrees Kelvin of the rare earth-barium-copper oxide ceramic used in Peltier cooler 22. This allows for standardization of the Joule-Thomson cooling gas used in all missile systems which has a significant logistic design advantage.

In addition, because of the high refrigeration power of argon, inherently faster cooldown times and overall size reduction of the dewar and cryostat assemblies are possible.

The second cooling stage, comprising Peltier cooler 22, is tailored to achieve a wide range of cold temperatures below 87 degrees Kelvin and can easily be used to implement a closed loop temperature control to provide a high degree of temperature stability. Thus, by being able to arbitrarily set the cold temperature within the infrared detector assembly 10 below 87 degrees Kelvin, an operating cold temperature can be stable and fixed to optimize the performance characteristics of whatever detector or array type may be utilized. For example, a Schottky infrared focal plane array has a strong dark current temperature dependence and a critical operational knee around 78 degrees Kelvin. Above this temperature noise increases and detector sensitivity falls off dramatically. A nitrogen Joule-Thomson cryostat, normally used for cooling such focal plane arrays, provides marginal temperature stability and cooling power for such an array. Any small variation in temperature provided by the cryocooler has dramatic effects on the sensitivity, gain and fixed pattern noise of the infrared detector. In another detector, such as long wavelength mercury cadmium telluride, temperatures below 77 degrees Kelvin are required, with 65 degrees Kelvin being preferred, in order to realize the optimum performance since the diode resistance-area product and array uniformity are temperature dependent. Infrared detectors cooled with the configuration of FIGS. 1 and 6 can thus readily be employed with obvious advantage in Schottky or long wavelength infrared detectors of this type.

Furthermore, the use of an argon Joule-Thomson cryostat stage cools the substrate masses of the detector and cold shield directly with the result that fast cooldown times are achieved. Only the mass of the focal plane array itself is cooled by Peltier cooler 22. Since the thermal mass of the focal plane array is very small, the Peltier cooler can be custom designed to the thermal mass of the array in combination with the design of the argon Joule-Thomson cryostat to achieve a fast total system cooldown time.

In the embodiment of FIG. 6, the Peltier cooler is disposed onto the ceramic detector card 24 so that its hot junctions are in thermal contact with card 24. Therefore, the cold junctions provided at the opposing surface 92 are made available for thermal contact with a focal plane array. It can be appreciated from the depiction of FIG. 6 that the cold shield 18 is mechanically and thermally coupled to card 24, as are adjacent portions of cryostat 26. There is no direct thermal contact of cryostat 26 or cold shield 18 with Peltier cooler 22. However, Peltier cooler 22 is directly thermally coupled to an intermediate alumina substrate 94 underneath the focal plane array 16. The readout integrated circuit chip 96 which is part of the focal plane array, along with the detector array 98, is disposed on and in thermal contact with substrate 94, with detector array 98 being disposed upon the readout integrated circuit chip 96. The thermal mass which the Peltier cooler 22 must cool, and the only mass which is thermally coupled to its cold junctions, are thus a mass of elements 94-96-98 which are very small compared to the thermal mass of the remaining portions of the detector assembly 10.

Many modifications and alterations may be made by those having ordinary skill in the art without departing from the spirit and scope of the invention. For example, although the illustrated embodiment has been described in connection with the bismuth-telluride semiconductor, improvement of performance may be obtained by the use of other semiconductors in combination with the yttrium-barium, copper oxide ceramic superconductor. For example, an n-type bismuth-antimony ($Bi_{85}Sb_{15}$) has been found to also be a satisfactory semiconductor to be used in a superconducting Peltier cooler and has preliminarily proven to be superior to bismuth telluride. For example, the coefficient of performance for a yttrium-barium-copper oxide ceramic and bismuth-antimony Peltier cooler has been found to be approximately 1.9 as compared to 0.65 for an analogous cooler employing bismuth telluride as the semiconductor element. Specifically, with a heat sink of 87 degrees Kelvin and a cold temperature of 80 degrees Kelvin, refrigeration of 75 milliwatts has been found with power inputs of 40 milliwatts respectively. Heat rejection is 115 milliwatts.

Even without the superconductor thermopower contribution, the superconductor Peltier cooler with n-type $Bi_{85}Sb_{15}$ would perform satisfactorily by virtue of the absence of Joule heating losses in the superconductor. The COP of the superconductor Peltier cooler without using the superconductor thermopower is 0.65 at a T of 7 degrees K.

Therefore, the illustrated embodiment must be understood as given only for purposes of example and clarity and should not be taken as limiting the invention as defined in the following claims.

What is claimed is:

1. A Peltier cooling stack comprising:
   a first electrode;
   a superconducting layer electrically coupled to said first electrode;
   a semiconducting layer electrically coupled to said superconducting layer; and
   a second superconducting layer electrically coupled to said semiconductor layer; and
   a second electrode electrically coupled to said second superconducting layer, electrons flowing under an applied voltage from said first electrode through said first superconducting layer, semiconductor layer, second superconducting layer and second electrode, the electrical junction between said first superconducting layer and semiconductor providing Peltier cooling while the electrical junction between said semiconductor layer and said second superconducting layer providing Peltier heating,
   whereby a cryogenic Peltier cooling stack is provided.

2. The Peltier cooling stack of claim 1 further comprising first and second normally conducting metallic layers; said first superconducting layer and semiconducting layer being electrically coupled together through said first normally conducting metallic layer; said semiconducting layer and said second superconducting layer being electrically coupled together through said second normally conducting metallic layer; said first and second normally conducting metallic layers being disposed between said first superconducting layer and semiconducting layer, and between said semiconducting layer and said second superconducting layer, respectively in opposed spaced-apart positions from each other.

3. The Peltier cooling stack of claim 1 wherein said first and second superconducting layer is a high temperature superconducting ceramic.

4. The Peltier cooling stack of claim 3 where the high temperature superconducting ceramic is of the form

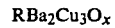

where R is a rare earth element and x is a finite number.

5. The Peltier cooling stack of claim 4 where said rare earth element is Yttrium.

6. The Peltier cooling stack of claim 1 wherein said semiconducting layer is bismuth telluride.

7. The Peltier cooling stack of claim 6 wherein said bismuth telluride is of the form, $Bi_2Te_3$.

8. The Peltier cooling stack of claim 7 wherein said bismuth telluride is n-doped.

9. The Peltier cooling stack of claim 1 wherein said semiconducting layer is an alloy of bismuth antimony.

10. The Peltier cooling stack of claim 9 wherein said bismuth antimony is of the form $Bi_{85}Sb_{15}$.

11. The Peltier cooling stack of claim 10 wherein said bismuth antimony alloy is n-doped.

12. A Peltier cooling stack comprising:
   a first electrode;
   a plurality of superconducting layers, a first one of said plurality of superconducting layers electrically coupled to said first electrode;
   a plurality of semiconducting layers, said pluralities of superconducting and semiconducting layers comprising an alternating sequence of semiconducting and superconducting layers, each layer of one of said pluralities being disposed adjacent to and electrically coupled with a layer from said other plurality of layers to comprise a series of Peltier junctions, one Peltier junction being formed between each electrically coupled and adjacent pair of said semiconducting and superconducting layers; and
   a second electrode electrically coupled to a last one of said layers of said plurality of superconducting layer, electrons flowing under an applied voltage from said first electrode through said alternating sequence of superconducting and semiconducting layers, the Peltier junctions between a first set of said superconducting layer and semiconductor layers providing Peltier cooling while said Peltier junctions between a second set of said semiconductor and superconducting layers providing Peltier heating.

13. The Peltier cooling stack of claim 12 wherein said semiconducting layer is bismuth telluride.

14. The Peltier cooling stack of claim 12 wherein said semiconducting layer is an alloy of bismuth antimony.

15. The Peltier cooling stack of claim 12 wherein said plurality of superconducting layers are formed of high temperature superconducting ceramic in the form of $RBa_2CO_3O_x$ where R is a rare earth element yttrium and x is a finite number.

16. The Peltier cooling stack of claim 14 wherein said bismuth antimony is of the form $Bi_{85}Sb_{15}$.

17. A Peltier cooling stack comprising:
   a plurality of thin film yttrium-barium-copper oxide ceramic high temperature superconducting layers;
   a plurality of layers of insulating material;
   a plurality of normal conducting metallic thin films; and
   a plurality of planar semiconductor wafers, said plurality of superconducting layers and semiconducting wafers forming an alternating array of one of said superconducting layers electrically coupled to and adjacent to one of said semiconducting layers electrically coupled to an adjacent to a following one of said superconducting layers and so forth, with a separate metallic thin film positioned between portions of adjacently disposed semiconducting and superconducting layers and a separate layer of insulating material positioned between remaining portions of said adjacently disposed layers, wherein said superconducting and semiconducting layers are electrically coupled together only through said normally conducting metal thin films,
   thereby providing a practical cryogenic Peltier cooling stack.

18. The Peltier stack of claim 17 wherein said array of said plurality of superconducting and semiconducting layers are bonded together by simultaneously brazing and pressing said pluralities of layers together in alternating array with indium thin films therebetween.

19. The Peltier cooling stack of claim 17 wherein said semiconducting wafer is of the form n-doped $Bi_{85}Sb_{15}$.

20. A method of fabricating a Peltier cooling stack comprising the steps of:
   assembling an alternating array of rare earth- barium-copper oxide superconductor thin films and semiconductor planar wafers, each superconducting film being adjacent to, electrically coupled to and preceding in said array a semiconductor wafer, each semiconductor wafer in turn being adjacent to and electrically coupled to a following superconducting thin film, each semiconductor wafer and superconducting thin film being separated by an insulating layer within said array except along a predetermined edge wherein is disposed a thin film metallic strip, said metallic strips disposed between each of semiconducting and superconducting layers arranged and configured in two sets, a first set disposed at one edge of said superconducting film and semiconducting wafers and a second set disposed at the opposite distal edge of said superconducting films and semiconducting layers, said first and second sets of normally conducting metallic strips forming an alternating array, said first set comprising a plurality of cold Peltier junctions and said second set comprising plurality of hot Peltier junctions;
   brazing said plurality of semiconductor wafers, superconducting films and metallic strips together; and
   simultaneously pressing said plurality of semiconductor wafers and superconducting films and metallic strips together during said step of brazing.

* * * * *